United States Patent [19]

Dickinson et al.

[11] Patent Number: 4,659,649

[45] Date of Patent: * Apr. 21, 1987

[54] PHOTOSENSITIVE SYSTEMS SHOWING VISIBLE INDICATION OF EXPOSURE

[75] Inventors: Peter Dickinson; Michael Ellwood, both of Broadstairs, England

[73] Assignee: Sericol Group Limited, London, England

[*] Notice: The portion of the term of this patent subsequent to Oct. 22, 2002 has been disclaimed.

[21] Appl. No.: 605,252

[22] Filed: Apr. 30, 1984

[30] Foreign Application Priority Data

May 6, 1983 [GB] United Kingdom ............... 8312416

[51] Int. Cl.$^4$ .................. G03C 1/68; G03C 1/727
[52] U.S. Cl. .................................. 430/280; 430/341;
430/292; 430/340; 430/338; 430/343; 430/344;
430/342; 430/922; 430/921; 430/925; 430/270;
252/586
[58] Field of Search ............... 430/341, 292, 340, 338,
430/343, 344, 342, 922, 921, 925, 280, 270;
252/586

[56] References Cited

U.S. PATENT DOCUMENTS

| | | |
|---|---|---|
| 2,066,913 | 1/1937 | Schmieg ............................ 261/92 |
| 2,618,555 | 11/1952 | Reichel ................................. 95/6 |
| 3,598,592 | 8/1971 | Cescon ............................. 430/340 |
| 3,729,313 | 4/1973 | Smith ........................... 430/340 X |
| 4,026,705 | 5/1977 | Crivello et al. ................. 96/27 R |
| 4,163,672 | 8/1979 | Stahlhofen ...................... 430/292 |
| 4,193,799 | 3/1980 | Crivello .......................... 430/319 |
| 4,264,703 | 4/1981 | Crivello ...................... 430/914 X |
| 4,350,753 | 9/1982 | Shelnut et al. ............... 430/292 X |
| 4,548,890 | 10/1985 | Dickinson et al. ............. 430/292 |

FOREIGN PATENT DOCUMENTS

| | | |
|---|---|---|
| 844039 | 8/1960 | United Kingdom . |
| 1041463 | 7/1966 | United Kingdom . |
| 1463717 | 9/1977 | United Kingdom . |
| 1516511 | 4/1978 | United Kingdom . |
| 1554389 | 10/1979 | United Kingdom . |
| 1556362 | 11/1979 | United Kingdom . |
| 2137626 | 10/1984 | United Kingdom ............ 430/280 |

OTHER PUBLICATIONS

"Applications of Photoinitiated Cationic Polymerization Toward the Development of New Photoresists", by J. V. Crivello, A.C.S. Div of ORPL Papers, 48, (1983).

"Photoinitiated Catonic Polymerization by Sulphonium Salts", by J. V. Crivello, General Electric Company, Schenectacy, New York.

Primary Examiner—John E. Kittle
Assistant Examiner—Cynthia Hamilton
Attorney, Agent, or Firm—Nixon & Vanderhye

[57] ABSTRACT

The invention provides new compositions which change color on exposure to actinic radiation and contain a photosensitive onium, e.g. iodonium or sulphonium, salt and a dyestuff which changes color when protonated. The compositions may also include a resin, especially a resin curable by the onium salt when the latter is exposed, and preferably an epoxy resin. The compositions are useful especially as coatings, e.g. for making screen stencils or for producing lithographic printing plates.

11 Claims, No Drawings

PHOTOSENSITIVE SYSTEMS SHOWING VISIBLE INDICATION OF EXPOSURE

The invention relates to photosensitive systems which on exposure to actinic radiation exhibit a marked colour contrast between exposed and unexposed areas so that an exposed image is clearly visible prior to development or any subsequent treatment. The invention is particularly useful in the production of screen printing stencils, but may also be used in making photoresists and in lithographic printing plates. The colour change of the exposed areas is a register aid in step-and-repeat, and multiple exposure, and also serves to show fogging, or that exposure has been correctly carried out.

In many photopolymerisable systems there is frequently a slight contrast between exposed and unexposed areas but this is usually of little practical value because the contrast is weak and not readily visible. The need for a readily visible latent image in photopolymerisable coatings prior to development has long been recognised, and a number of visible latent image systems are known in the field of photosensitive diazo-containing resins. For example, it is possible to incorporate in such resins salts which, in admixture with diazo compounds, give a coloured image on exposure (see U.S. Pat. Nos. 2,066,913 and 2,618,555). Coloured substances may also be generated by reaction between photodecomposition products of diazo compounds and other compounds (see British Specification No. 844,039).

It has also been reported that suitable indicator dyes, when incorporated with a diazo compound for use in, for example, lithographic plates, can change colour because of the increase in acidity associated with diazo photodecomposition (see British Specification No. 1,041,463). This system comprises formulations in which a considerable amount of diazo compound is present.

In our British patent application No. 8217461 (Ser. No. 2100874) we have described and claimed a water-based screen printing emulsion comprising a water-soluble colloid, a small amount of diazo sensitizer and an indicator dye.

Although the use of leuco triphenylmethane dyes to produce a colour change was demonstrated in British Pat. No. 1,463,717 they required the use of naphthoquinone diazide sulphonyl chloride.

In all these compositions a diazo compound is needed to achieve the necessary photopolymerisation and attendant colour change.

Other methods for producing visible latent images have been reported. Bleaching of light-sensitive dyes, i.e. dyes which become colourless on exposure to actinic radiation, generates a colour contrast. Photochromic dyes, i.e. dyes which change colour on exposure, have also been employed to give a colour contrast. However, both systems show poor colour contrast and resolution and as a consequence have not found widespread commercial use.

According to U.S. Pat. No. 4,193,799, epoxy and other cationically curable resins can be utilised for reprographic purposes using diaryliodonium and arylsulphonium salts as photoinitiators and certain cationic dyestuffs as photosensitizers. On exposure the photosensitizing dye exhibits a contrast with the surrounding unexposed areas. The type of dyestuff utilised in these compositions is limited to cationic dyes capable of acting as spectral sensitizers for diaryliodonium and arylsulphonium salt photoinitiators. There are many non-coloured photosensitizers which give a colour change on exposure to actinic radiation e.g. coumarin derviatives and phenothiazines; however, the contrast and fastness obtained are insufficient to be of commercial use.

The present invention provides compositions which exhibit a readily visible colour change on exposure to actinic radiation when applied to a suitable substrate. These new compositions comprise an onium salt, e.g. an iodonium or sulphonium salt preferably in admixture with a photosensitizer, and a non-sensitizing dyestuff as hereinafter defined. Upon exposure to actinic radiation the onium salt is thought to photodecompose to release a Bronsted acid which initiates the colour change reaction. This combination of onium salt and dyestuff may be incorporated in a wide variety of coating systems either for reprographic use e.g. lithographic coatings, screen printing stencils or as a warning of 'fogging' of photographic films etc., or for indication of accidental or deliberate exposure to actinic radiation. The term "dyestuff" as used herein means any compound which exhibits a readily visible colour change (including a change from colourless to coloured or vice versa) when protonated. There are many indicator dyestuffs which are employed specifically for pH detection for analytical purposes and those that show a visible change when protonated may be employed in this invention. However, the nature of the acid catalyst generated on exposure of the onium salt to actinic radiation, enables a much wider range of dyestuffs to be employed as colour change dyes than is possible using a diazo containing system. Many dyes containing an azo chromophore which would not exhibit a colour change on exposure in a diazo containing system will do so in the presence of an onium salt catalyst. This is a major advantage of the invention since this allows the use of inexpensive dyes not normally used as indicators.

The dyestuffs mentioned in U.S. Pat. No. 4,193,799 were limited to the few compounds capable of sensitizing the photodecomposition of the iodonium and sulphonium salts. The dyestuffs used in the present invention are not employed to sensitize the iodonium or sulphonium photoinitiators and as a consequence a much wider range of colours and chemical structures can be employed. A further advantage of the invention is that simple dyestuffs with insufficient fastness properties to be useful as textile dyes may be used as indicating materials.

Examples of suitable dyestuffs include leuco bases of di- and tri-phenylmethane dyes (which readily oxidize in the presence of atmospheric oxygen), aminoazo dyes, and aminoanthraquinones e.g. dyestuffs of formulae:

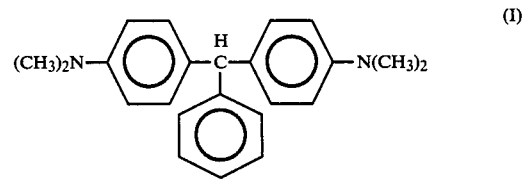

(I)

leuco malachite green

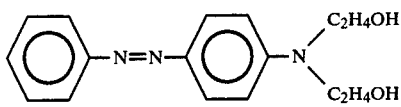 (II)

N,N-bis(2-hydroxyethyl)-4-amino-azobenzene

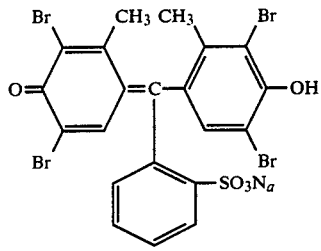 (III)

Bromocresol Green

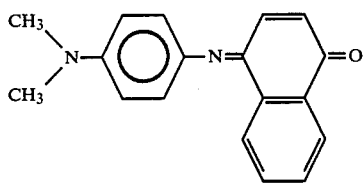 (IV)

Indophenol Blue, and

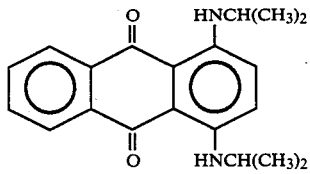 (V)

Waxoline Blue AP (C.I. Solvent Blue 36)

The preferred onium salts are iodonium and sulphonium salts. The iodonium salts preferably have the formula:

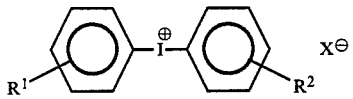

where each of $R^1$ and $R^2$ is hydrogen, straight chain or branched alkyl, alkoxy, aryl, acyl, nitro, cyano, or halogen and $X^\ominus$ is a strong acid anion, e.g. $Cl^-$, $HSO_4^-$, or alkyl- or aryl-sulphonate or phosphonate but the preferred embodiment uses a complex metal or metalloid anion e.g. tetrafluoroborate, hexafluorophosphate, hexafluoroarsenate, hexafluoroantimonate, perchlorate or trifluoromethane-sulphonate.

The sulphonium salts preferably are of the formula:

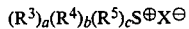

where $X^\ominus$ is as defined above, $R^3$ is a monovalent aromatic radical which may be substituted by one or more alkyl (including substituted alkyl), aryl, alkoxy, hydroxy, phenoxy, thiophenoxy, mercaptan or acyl groups or halogen atoms, $R^4$ is a monovalent organic aliphatic radical selected from alkyl, cycloalkyl or substituted alkyl, $R^5$ is a polyvalent organic radical forming a heterocyclic or fused ring structure with $S^\oplus$, 'a' is a whole number from 0 to 3 inclusive, 'b' is a whole number from 0 to 2 inclusive, 'c' is 0 to 1, and the sum $a+b+c=3$.

The onium salts are normally used in the new compositions in the proportion of up to 10% by weight.

A photosensitizer is preferably added to increase the spectral sensitivity of the onium salt. The preferred such sensitizers are 9,10-diethoxyanthracene and 2-alkyl-9,10-diethoxyanthracenes. Other compounds such as phenothiazine, diazo or azido compounds, and polyaromatic hydrocarbons, e.g. perylene, may also be used. The proportion of sensitizer employed is generally up to 5% by weight of the composition.

The composition of this invention may be aqueous or organic based. Also incorporated into these compositions there may be suitable resins dissolved or dispersed for film forming purposes. These resins could be water soluble e.g. polyvinyl alcohol, polyvinyl pyrrolidone, gelatin, casein or cellulose ethers; or water dispersed e.g. polyvinyl acetate homopolymer and copolymer dispersions, acrylate dispersions; or solvent soluble resins e.g. nitrocellulose, phenolic vinyl or polyester resins; dissolved in solvents or dispersed in aqueous media using colloid or surfactant stabilisers.

The resins may be modified in such a way to make them reactive, e.g. by inclusion in them of appended epoxy, methylol or unsaturated groups in order to render the composition crosslinkable. Reactive diluents may be added in order to facilitate this reactivity. Compounds to specifically sensitize this reactivity may also be added, for example compounds containing diazo or azido groups, or free radical initiators such as benzildimethylketal or acetophenone derivatives. Resins may be modified with sensitizing groups to provide crosslinking, degradation or solubilisation after exposure, for example by incorporating in the resin the product of esterifying a naphthoquinone diazide sulphonic acid with a novolac resin or the formaldehyde condensation product of diphenylamine diazo sulphate.

In a preferred embodiment of the invention onium salts with complex halide anions are utilised to cure certain cationically curable resins as well as to provide a clear visible image.

The cationically curable resins which may be used include, e.g. cyclic ethers, polysiloxanes, polyvinyl ethers, polyvinylacetals and epoxy resins. It is preferable to use epoxy resins because of their superior resistance to wear and chemical attack. Such epoxy resins contain a plurality of epoxy functional groups per molecule and may be based on: reaction products of Bisphenol A and epichlorhydrin, e.g. the Araldites of Ciba-Geigy; the reaction products of epichlorhydrin and a phenol-formaldehyde resin of relatively low molecular weight, i.e. epoxy Novolacs (e.g. those sold by Dow); or other epoxy modified resins as described in 'UV Curing Science and Technology' (Technology Marketing Corp. Stamford, Conn.). These oligomeric or polymeric resins may be used alone or in conjunction with a reactive diluent such as glycidyl ether, alkyl glycidyl ether, glycidyl acrylate, styrene oxide, 4-vinylcyclohexanone dioxide, limonene dioxide, 1,2-cyclohexene oxide, or 3,4-epoxycyclohexylmethyl-3,4-cyclohexanecarboxylate, which may be added as viscosity modifying agents.

These resins may be employed as up to 98% by weight of the composition depending on the end use in a manner known to those skilled in the art.

It may be desirable to include in the compositions of the invention an inert filler which may be, for example, starch, kaolin, silica or titanium dioxide. These fillers serve to modify the properties of dried films to render them suitable for the intended use. Such fillers may comprise 0 to 10% by weight of the composition. A plasticizer e.g. a dialkylphthalate or phosphate ester, may also be added in a proportion up to 15% by weight to improve the flexibility of the exposed composition. Pigments or non colour changing dyes may also be included in the composition to improve its performance.

Water-based compositions of the invention containing dispersed resins, fillers or other materials may be stabilized by inclusion therein of a water-soluble colloid such as one of those mentioned above.

A small amount of biocide may be added if desired to prevent biological attack on compositions containing colloids and thus enhance long term storage stability. Alternatively, or in addition, surfactants, preferably non-ionic surfactants, may be added to aid stabilisation of water-based compositions.

The compositions of the invention may be used to produce photosensitive coatings capable of producing a visible latent image on exposure and before development or other subsequent treatment. Such coatings have wide application. They may, for example, be used for the detection of actinic radiation or in photocopying. Compositions curable by free radical processes, e.g. known compositions for making screen stencils, may be made so that they show a clear colour change on exposure. Preferably, however, the compositions of the invention include a cationically curable monomer, oligomer or polymer so that the exposure to actinic radiation both causes the colour change and brings about curing of the coating. For example, an aqueous dispersion of epoxy resin dyestuff and onium salt photoinitiator can be coated on a screen printing mesh, on a metal or other plate for use as a lithographic printing plate or for photo-engraving, or on a copper clad laminate for use as a printed circuit resist, and then dried to give a coating, which, after exposure, is cured and shows a visible latent image. Such coatings can be used for multiple exposures where the coating is exposed through a mask, recoated and the process repeated a number of times prior to development. The clear visibility of the latent image makes possible accurate registration of the coating prior to each successive exposure.

The new coatings can also be advantageously employed in a step-and-repeat process in which a coating bears many identical images. This is achieved by portionwise exposure of the coating to a single positive, the remainder of the stencil being masked. The visibility of the latent image prevents accidental overlapping and double exposure by the operator.

An additional advantage of the new coatings is that accidental exposure of a precoated surface, i.e. 'fogging', causes a colour change which is readily recognisable. Similarly underexposure of a stencil can be recognised by a colour contrast on the front of the stencil and not on the reverse.

The exposed coating may be developed in conventional manner, usually by washing away unexposed areas with a suitable medium.

The following Examples illustrate the invention.

EXAMPLE 1

The following formulations were made up:

A.
100 g 18% Polyvinylformal in benzyl alcohol
30 g DEN 438 ①
12.7 g CY 179 ②
10 g 29% VAGD ③ in benzyl alcohol
1.2 g Diacetone Alcohol
1.0 g FC 510 ④

B.
5 g diphenyliodonium hexafluorophosphate
5 g Methyl ethyl ketone (MEK)
0.2 g N,N-bis-(2-hydroxyethyl)-4-amino-azobenzene ① DEN 438 is an epoxy Novolac resin supplied by Dow.
② CY 179 is 3,4-epoxycyclohexylmethyl-3,4-cyclohexanecarboxylate, a reactive epoxy diluent supplied by Ciba Geigy.
③ VAGD is a polyvinylacetate-polyvinylchloride copolymer supplied by Union Carbide.
④ FC 510 is 9,10-diethoxyanthracene photosensitizer supplied by 3M.

The resins and solvents in A were mixed together in sequence. To the mixture obtained the solution B of photoinitiators and dye in MEK was added. The composition was coated on both sides of a 34 threads/cm polyester screen printing mesh, dried under warm air and exposed imagewise to a 800 W medium pressure mercury halide lamp at a distance of 1 m. for 300 seconds. The exposed areas were clearly visible as a red image on a yellow background. The stencil was developed with MEK and a high definition tough stencil capable of use for screen printing was obtained.

EXAMPLES 2–6

The following formulations were made up:

|  | Parts by weight |
|---|---|
| 13% aqueous solution polyvinyl alcohol (Gohsenol GH 20) | 55 |
| RD 2 ⑤ | 14 |
| DEN 438 | 6 |
| CY 179 | 3.25 |
| 4-Thiophenoxytriphenylsulphonium hexafluorophosphate | 2 |
| VAGD | 0.7 |
| Diacetone alcohol | 0.55 |
| FC 510 | 0.5 |
| Berol 02 ⑥ | 0.2 |
| Dyestuff (see below) | 0.1 |

⑤ RD 2 is an epoxy resin, viz. butanediol diglycidyl ether obtainable from Ciba Geigy
⑥ Berol 02 is a nonylphenyl polyoxyethylene non-ionic surfactant.

The formulations were coated onto both sides of a 90 threads/cm screen printing mesh, dried under warm air and then exposed imagewise to an 800 W mercury halide lamp at a distance of 1 meter for 600 seconds. In each Example a readily visible coloured contrast was observed between the exposed and unexposed areas of the stencil, as given in Table 1 below. After washing out the unexposed areas with water, a stencil suitable for screen printing was obtained.

TABLE I

| EXAMPLE | DYESTUFF | UNEXPOSED AREA | EXPOSED AREA |
|---|---|---|---|
| 2 | N,N—bis(2-hydroxyethyl)-4-amino-azobenzene | yellow | red |
| 3 | Bromocresol Green | green | yellow |
| 4 | leuco malachite green | colourless | green |
| 5 | Dispersol Rubine D3B (ex ICI) | magenta | cream |

TABLE I-continued

| EXAMPLE | DYESTUFF | UNEXPOSED AREA | EXPOSED AREA |
|---|---|---|---|
| 6 | Indophenol Blue | blue | yellow |

EXAMPLE 7

2 g of a diazo resin ester (15% esterified) obtained from Ward Blenkinsop and Co. Ltd. which is a novolac resin esterified with 2-diazo-1 oxo naphthoquinone 5-sulphonic acid, was dissolved in 100 ml acetone. 0.08 g Waxoline Blue AP, obtained from ICI Ltd., was added and dissolved. This was coated onto a piece of anodised electrograin lithoplate dried and imagewise exposed to actinic radiation. No clear colour change was obtained.

When however 0.16 g 4-Thiophenoxytriphenyl sulphonium hexafluorophosphate and 0.04 g of diethoxy anthracene were added to the coating solution, after similar coating and exposure, a contrasting blue to red colour change was obtained.

EXAMPLE 8

A solution of 0.5 g 4-Thiophenoxytriphenyl sulphonium hexafluorophosphate, 0.1 g Perylene and 0.1 g Bromocresol Green, in 2.0 g Acetone was mixed with 10 g of an acrylic lacquer.

When coated onto a pvc film at 20 microns film thickness and exposed to a 800 Watt Mercury Halide lamp at 1 meter for 900 secs the exposed areas produced a colour change from green to yellow.

We claim:

1. A composition which changes colour on exposure to actinic radiation comprising a photosensitive iodonium or sulphonium salt and a non-photosensitizing dyestuff which exhibits a readily visible colour change when protonated.

2. A composition according to claim 1 which also comprises a non-photoreactive vehicle.

3. A composition according to claim 1 which also comprises a photoreactive vehicle which is not cationically cured.

4. A composition according to claim 1 which also comprises a cationically curable monomer, oligomer or polymer which, at least in the cured state, is film forming.

5. A composition according to claim 4 in which the said monomer, oligomer, or polymer is an epoxy compound.

6. A composition according to claim 4, in the form of an aqueous dispersion in which the dispersed phase comprises a said cationically curable monomer, oligomer or polymer and the aqueous phase comprises a surfactant and/or a water-soluble colloid.

7. A composition according to claim 1 in which the dyestuff is a di- or tri-phenylmethane compound, or an amino-azo compound.

8. A composition according to claim 7 in which the dyestuff in N,N-bis(2-hydroxyethyl)-4-amino-azobenzene or leuco malachite green.

9. A composition according to claim 1 in which the said onium salt is an iodonium or sulphonium salt having a complex metal or metalloid halide anion.

10. A composition according to claim 9 in which the said onium salt has the anion $BF_4^-$, $PF_6^-$, $AsF_6^-$, or $SbF_6^-$.

11. A composition according to claim 1 which also contains a photosensitizer.

* * * * *